(12) United States Patent  (10) Patent No.: US 12,094,724 B2
Chuang  (45) Date of Patent: *Sep. 17, 2024

(54) METHOD OF PREPARING ACTIVE AREAS

(71) Applicant: NANYA TECHNOLOGY CORPORATION, New Taipei (TW)

(72) Inventor: Ying-Cheng Chuang, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/377,422

(22) Filed: Oct. 6, 2023

(65) Prior Publication Data
US 2024/0038548 A1 Feb. 1, 2024

Related U.S. Application Data

(63) Continuation of application No. 17/828,802, filed on May 31, 2022, now Pat. No. 11,830,744.

(51) Int. Cl.
*H01L 21/3213* (2006.01)
*H01L 21/027* (2006.01)
*H01L 21/321* (2006.01)
*H01L 21/762* (2006.01)

(52) U.S. Cl.
CPC .... *H01L 21/32139* (2013.01); *H01L 21/0274* (2013.01); *H01L 21/32115* (2013.01); *H01L 21/76224* (2013.01)

(58) Field of Classification Search
CPC ........... H01L 21/32139; H01L 21/0274; H01L 21/32115; H01L 21/76224
See application file for complete search history.

(56) References Cited

U.S. PATENT DOCUMENTS

| | | | |
|---|---|---|---|
| 11,527,408 B2 * | 12/2022 | Yang | H01L 21/0337 |
| 11,830,744 B1 * | 11/2023 | Chuang | H01L 21/0274 |
| 2019/0067020 A1 * | 2/2019 | Tsai | H01L 21/3081 |
| 2020/0152462 A1 * | 5/2020 | Park | H01L 21/3088 |
| 2021/0305084 A1 * | 9/2021 | Lin | H01L 29/78696 |
| 2021/0358764 A1 * | 11/2021 | Wu | H01L 21/31111 |
| 2022/0367625 A1 * | 11/2022 | Liu | H01L 29/66742 |
| 2022/0367683 A1 * | 11/2022 | Chen | H01L 27/088 |

* cited by examiner

Primary Examiner — Binh X Tran
(74) Attorney, Agent, or Firm — Xuan Zhang

(57) ABSTRACT

The present disclosure provides a method of preparing active areas. The method includes the operations of: receiving a substrate having an oxide layer, a nitride layer, and a silicon layer thereon; forming a patterned photoresist layer on the silicon layer; depositing a mask layer to cover a contour of the patterned photoresist layer; coating a carbon layer on the mask layer; etching the carbon layer, the mask layer, and the silicon layer to expose a top surface of the nitride layer; forming a plurality of opens in the oxide layer to expose a top surface of the substrate; and growing an epitaxial layer from the top surface of the substrate in the plurality of opens to form the active areas.

20 Claims, 22 Drawing Sheets

METHOD OF PREPARING ACTIVE AREAS

CROSS-REFERENCE TO RELATED APPLICATION

This application is a continuation application of U.S. Non-Provisional application Ser. No. 17/828,802 filed May 31, 2022, which is incorporated herein by reference in its entirety.

TECHNICAL FIELD

The present disclosure relates to a method of preparing semiconductor structures, and more particularly, to a method of preparing active areas.

DISCUSSION OF THE BACKGROUND

In the semiconductor industry, the critical dimension has been continuously decreased. However, it is also more challenging when fabricating smaller and uniform elements. Especially, the uniformity of the semiconductor elements is crucial to the yield rate of the semiconductor manufacturing. Moreover, the yield rate is highly related to the cost. Therefore, looking for a better method to fabricate the semiconductor structures which can meet the requirements (i.e., the uniformity and/or the cost) is always an important issue in this field.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a method of preparing active areas. The method includes the operations of: receiving a substrate having an oxide layer, a nitride layer, and a silicon layer thereon; forming a patterned photoresist layer on the silicon layer; depositing a mask layer to cover a contour of the patterned photoresist layer; coating a carbon layer on the mask layer; etching the carbon layer, the mask layer, and the silicon layer to expose a top surface of the nitride layer; forming a plurality of opens in the oxide layer to expose a top surface of the substrate; and growing an epitaxial layer from the top surface of the substrate in the plurality of opens to form the active areas In some embodiments, the method further includes removing the patterned photoresist layer, the mask layer, and the carbon layer.

In some embodiments, the method further includes performing a chemical mechanical planarization to planarize the active areas and the oxide layer. The active areas and the oxide layer are coplanar after the chemical mechanical planarization.

In some embodiments, the method further includes using the active areas to form a plurality of transistor structures.

In some embodiments, the oxide layer includes shallow trench isolations of the plurality of transistor structures.

In some embodiments, receiving the substrate having the oxide layer, the nitride layer, and the silicon layer thereon includes operations of: depositing the oxide layer on the substrate; depositing the nitride layer on the oxide layer; and depositing the silicon layer on the nitride layer.

In some embodiments, the oxide layer includes silicon oxide, the nitride layer includes silicon nitride, and the silicon layer is an amorphous silicon layer.

In some embodiments, forming the patterned photoresist layer on the silicon layer includes operations of: disposing a photoresist layer on the silicon layer; performing a photolithography to transfer the photoresist layer to be a plurality of photoresist objects on the silicon layer; and trimming the plurality of photoresist objects to form the patterned photoresist layer.

In some embodiments, a width of each of the plurality of photoresist objects after trimming is less than a width of each of the plurality of photoresist objects before trimming.

In some embodiments, a dimension of each of the plurality of photoresist objects after trimming is less than a dimension of each of the plurality of photoresist objects before trimming.

In some embodiments, performing the photolithography to transfer the photoresist layer to be the plurality of photoresist objects on the silicon layer includes operations of: patterning the photoresist layer according to a pattern of a mask; and etching the photoresist layer to form the plurality of photoresist objects.

In some embodiments, trimming the plurality of photoresist objects to form the patterned photoresist layer includes providing a gas; and increasing a temperature of the gas to etch the plurality of photoresist objects, so as to trim the photoresist objects.

In some embodiments, the gas includes oxygen.

In some embodiments, the mask layer is deposited using an atomic layer deposition.

In some embodiments, the mask layer includes silicon oxide.

In some embodiments, the mask layer includes silicon nitride.

In some embodiments, etching the carbon layer, the mask layer, and the silicon layer to expose the top surface of the nitride layer includes operations of: using a first etchant to etch the carbon layer to expose a top surface of the mask layer; using a second etchant to etch the mask layer to expose a top surface of the patterned photoresist layer and a top surface of the silicon layer; and using a third etchant to etch the silicon layer to expose a top surface of the nitride layer.

In some embodiments, the first etchant is different from the second etchant, and the second etchant is different from the third etchant.

In some embodiments, a width of each of the opens ranges from about 14 nm to 30 nm.

In some embodiments, the epitaxial layer comprises silicon.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
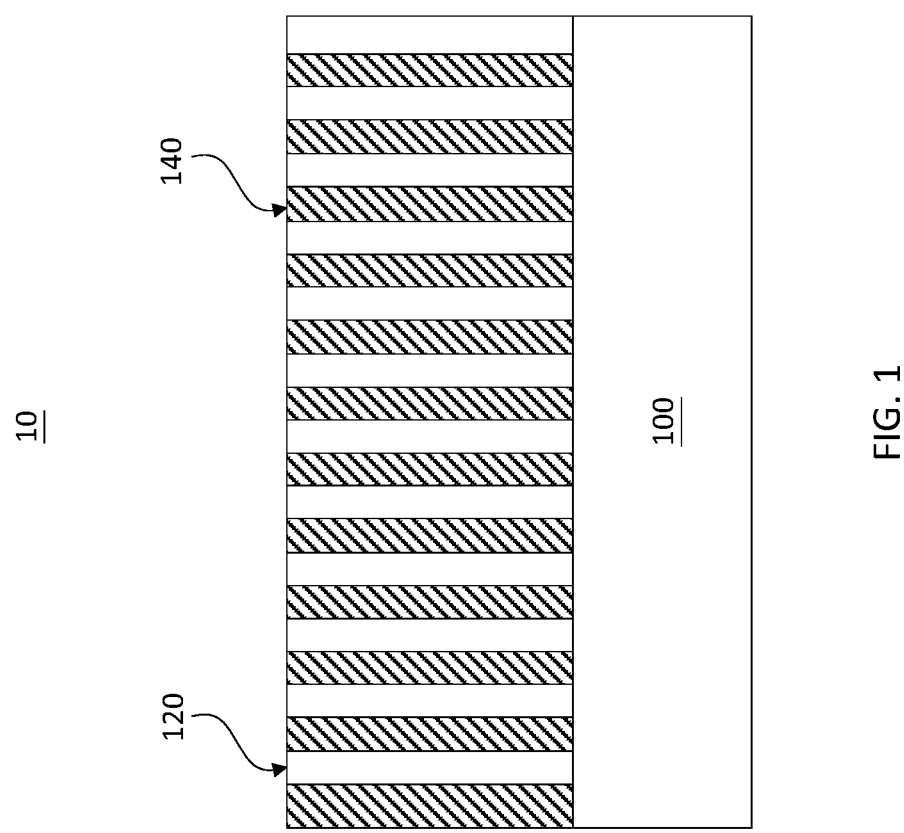
FIG. 1 is a schematic diagram of a semiconductor structure according to some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

FIG. 1 is a schematic diagram of a semiconductor structure 10 according to some embodiments of the present disclosure. The semiconductor structure 10 includes a substrate 100, a plurality of shallow trench isolations (STIs) 120, and a plurality of active areas 140.

The STIs 120 stand on the substrate 100, and the active areas 140 and the STIs 120 are alternately disposed. In some embodiments, the semiconductor structure 10 is configured to be process to be transistor structures. In this embodiments, the active areas 140 are source/drain regions of the transistor structures, and the STIs 120 are the STI of the transistor structures. In some embodiments, the active areas 140 are fin structures in the transistor structures. It should be noted that the transistor structures are provided for exemplary purposes, and the present disclosure is not limited thereto. Various structures suitable for the semiconductor structures 10 are within the contemplated scope of the present disclosure.

Reference is made to FIG. 2 to FIG. 16. FIG. 2 to FIG. 16 are schematic diagrams of each manufacturing steps of the semiconductor structure 10 according to some embodiments of the present disclosure.

Figure 2:
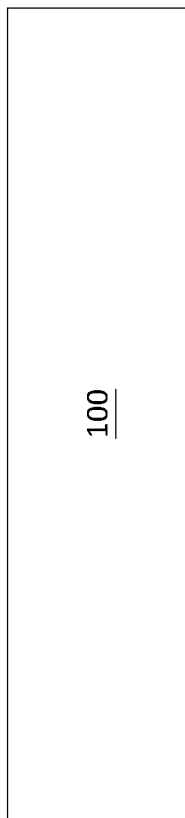
FIG. 2 is a schematic diagram of a manufacturing step of the semiconductor structure according to some embodiments of the present disclosure.

Referring to FIG. 2, the substrate 100 is received. In some embodiments, the substrate 100 is a silicon wafer. In other embodiments, the substrate 100 includes other material other than silicon.

Figure 3:
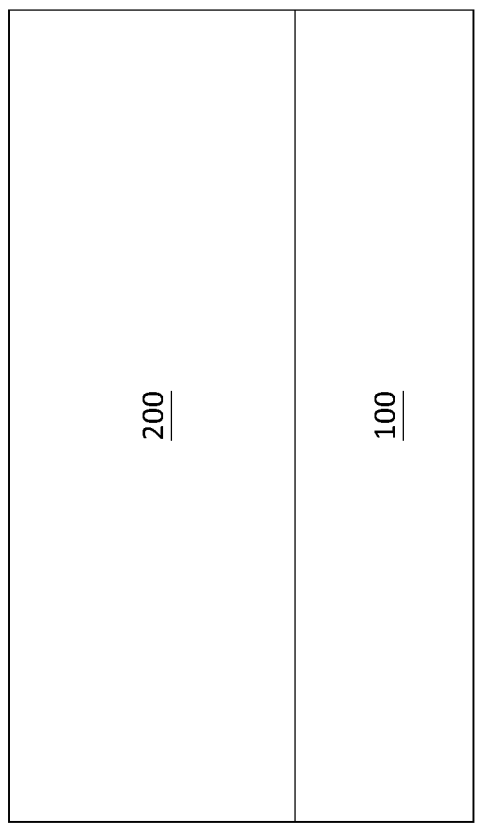
FIG. 3 is a schematic diagram of a manufacturing step of the semiconductor structure according to some embodiments of the present disclosure.

Referring to FIG. 3, an oxide layer 200 is deposited on the substrate 100. The oxide layer 200 includes silicon oxide. The oxide layer 200 will be processed to form the STIs 120 shown in FIG. 1. In some embodiments, a thickness of the oxide layer 200 is about 250 nm to about 450 nm. It should be noted that the thickness of each element shown in FIG. 1 to FIG. 16 is provided for illustrative purposes. The actual thickness of each element does not limited to the drawings. For example, the thickness of the substrate 100 is much greater than the thickness of the oxide layer 200.

Figure 4:
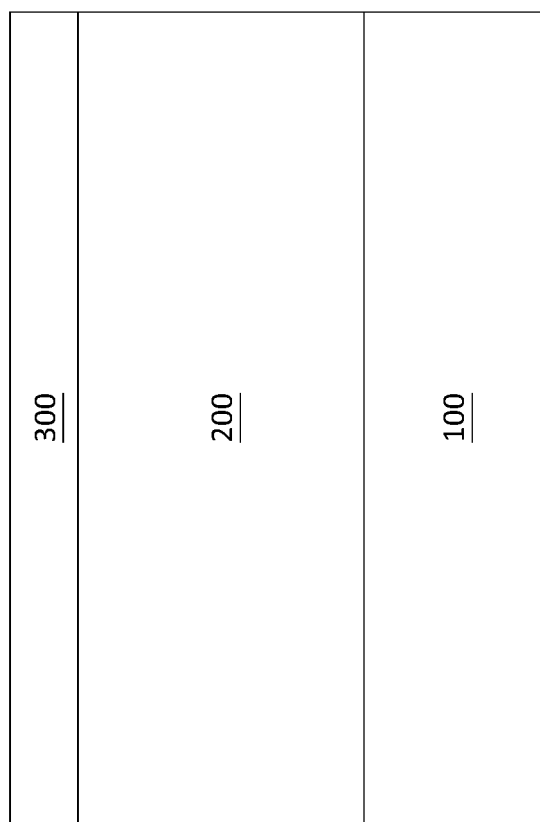
FIG. 4 is a schematic diagram of a manufacturing step of the semiconductor structure according to some embodiments of the present disclosure.

Referring to FIG. 4, a nitride layer 300 is deposited on the oxide layer 200. In some embodiments, the nitride layer includes silicon nitride. In some embodiments, a thickness of the nitride layer 300 is about 50 nm to about 150 nm.

Figure 5:
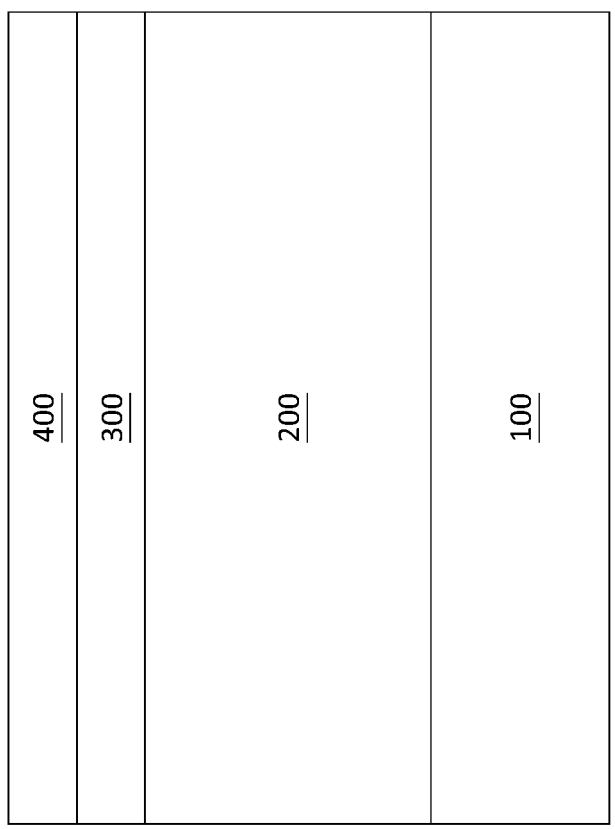
FIG. 5 is a schematic diagram of a manufacturing step of the semiconductor structure according to some embodiments of the present disclosure.

Referring to FIG. 5, a silicon layer 400 is deposited on the nitride layer 300. In some embodiments, the silicon layer 400 is an amorphous silicon (a-Si) layer. In some embodiments, a thickness of the silicon layer 400 is about 50 nm to about 150 nm.

Figure 6:
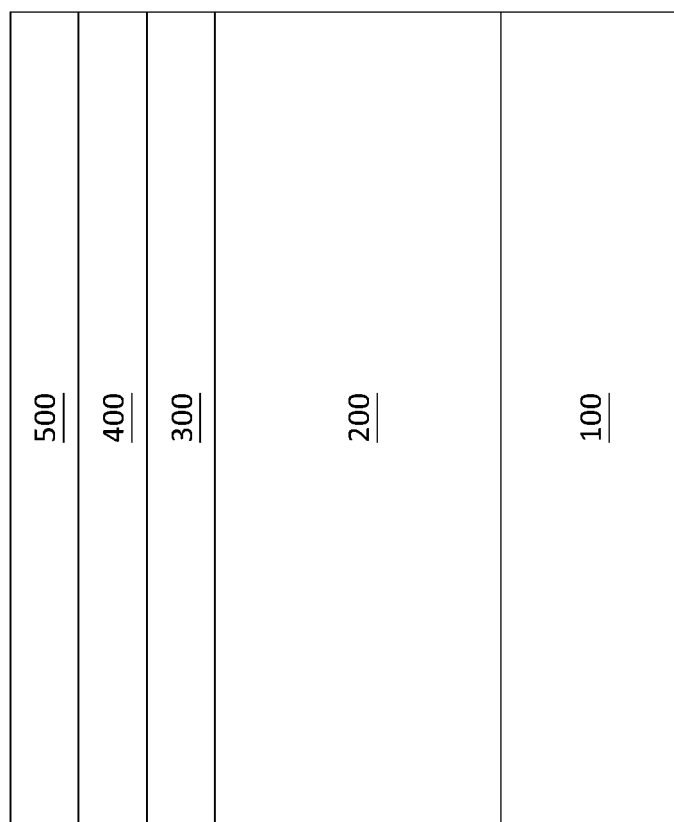
FIG. 6 is a schematic diagram of a manufacturing step of the semiconductor structure according to some embodiments of the present disclosure.

Referring to FIG. 6, a photoresist layer 500 is deposited on the silicon layer 400. In some embodiments, the photoresist layer 500 includes carbon chain compounds. In some embodiments, the photoresist layer 50 includes a positive resist or a negative resist.

Figure 7:
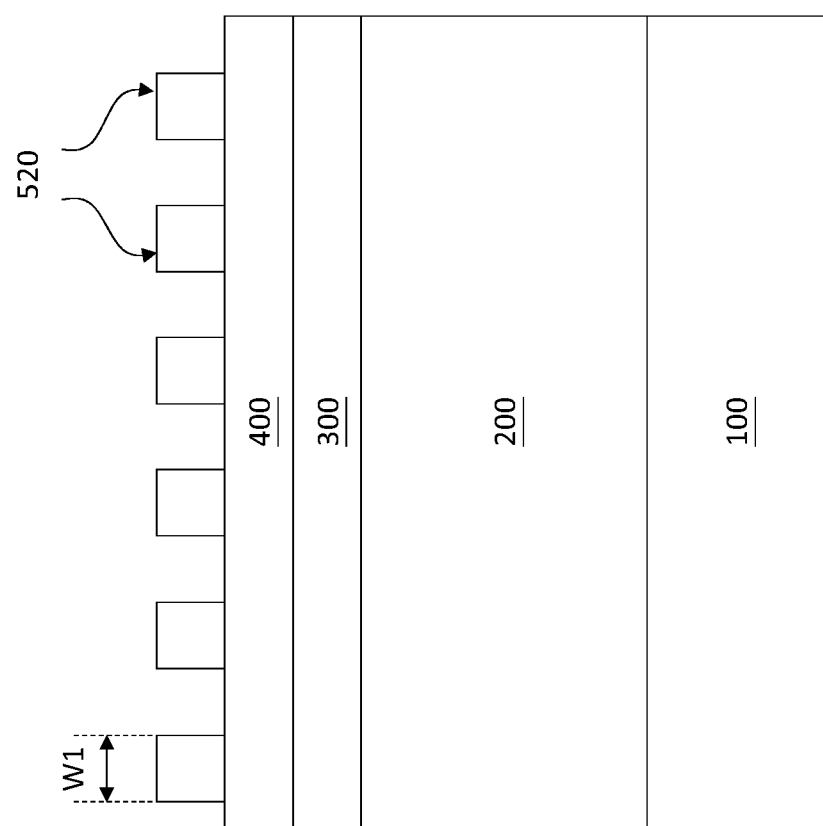
FIG. 7 is a schematic diagram of a manufacturing step of the semiconductor structure according to some embodiments of the present disclosure.

Referring to FIG. 7, a photolithography is performed on the photoresist layer 500 to form a plurality of photoresist objects 520. More specifically, the photoresist layer 500 is patterned according to a pattern of a mask. In other words, the pattern is transferred to the photoresist layer 500. Then, the photoresist layer 500 is etched according to the pattern to form the plurality of photoresist objects 520. The photoresist objects 520 are the remaining portion of the photoresist layer 500 after etching.

Figure 8:
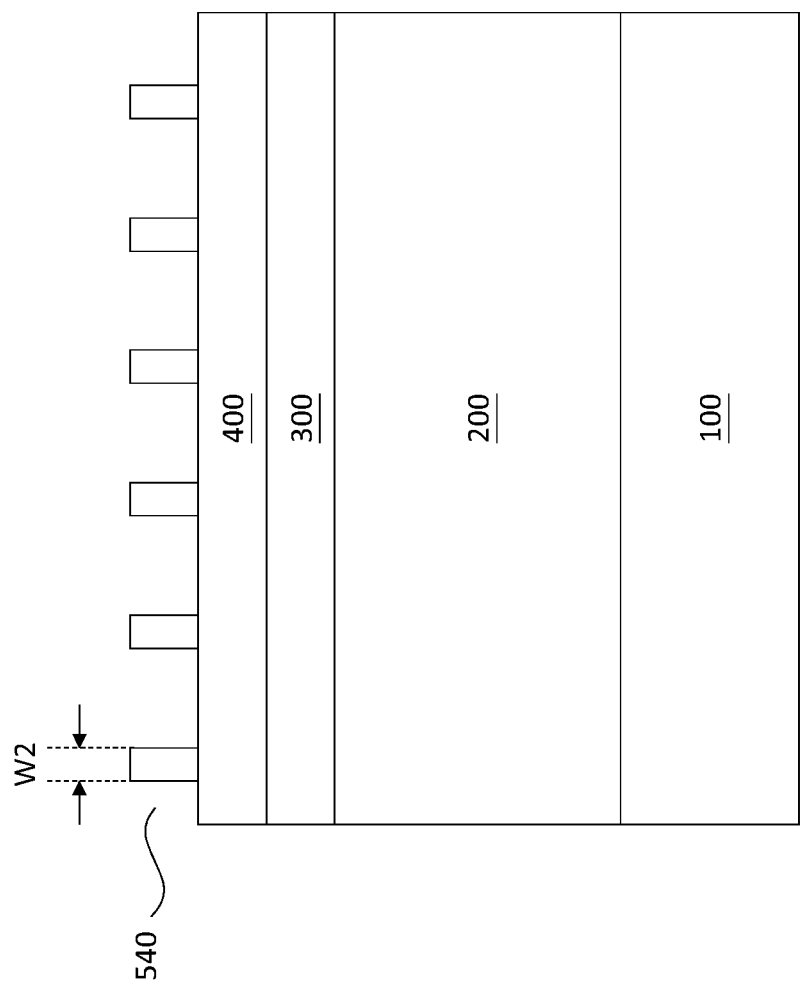
FIG. 8 is a schematic diagram of a manufacturing step of the semiconductor structure according to some embodiments of the present disclosure.

Referring to FIG. 8, the photoresist objects 520 are trimmed to form a patterned photoresist layer 540. Each of the photoresist objects 520 is trimmed, and a dimension of each of the photoresist objects 520 is decreased. For example, a width W1 (before trimming shown in FIG. 7) of the photoresist object 520 is about 38 nm to about 50 nm, and a width W2 of photoresist object 520 after trimming is about 26 nm to about 36 nm. The plurality of photoresist objects 520 after trimming are also referred to as the patterned photoresist layer 540.

In some embodiments, trimming the photoresist objects 520 is performed in a chamber, such as a chamber configured to perform a diffusion process. A gas is provided to the chamber, and an environment in the chamber is heated. As Such, a temperature of the photoresist objects 520 and the gas are increased to initiate the trimming. In some embodiments, the gas includes oxygen and/or nitrogen.

Figure 9:
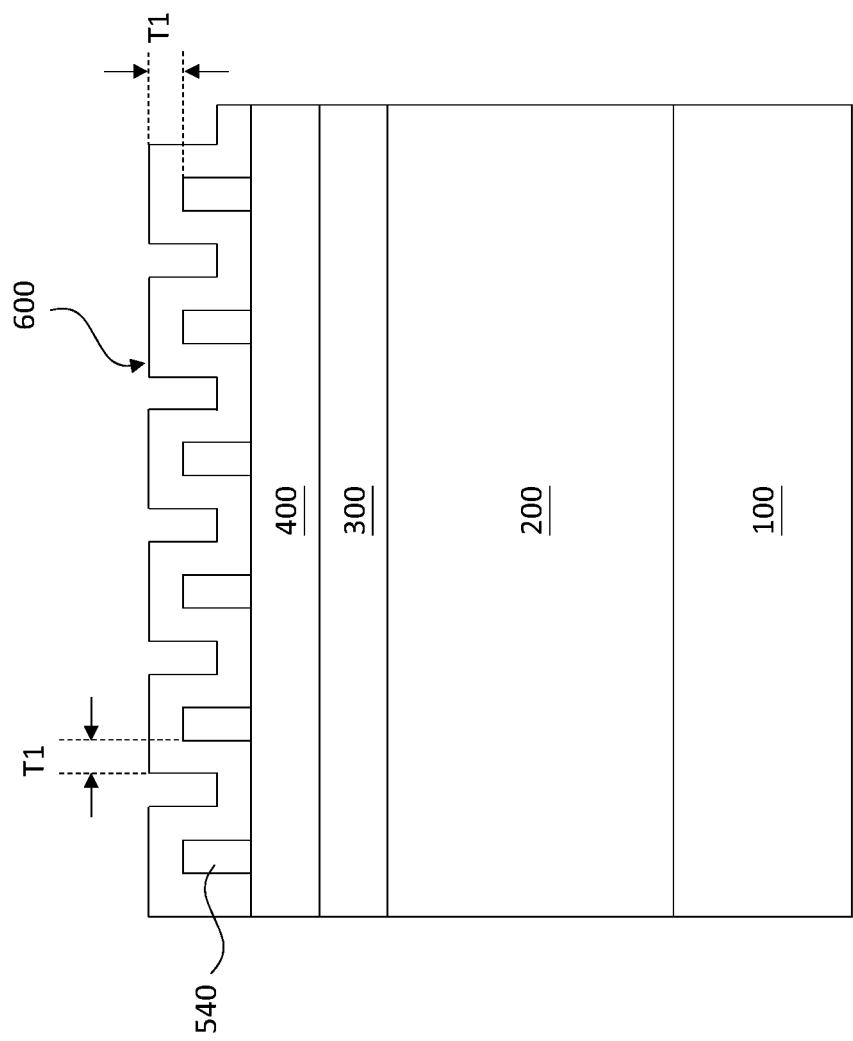
FIG. 9 is a schematic diagram of a manufacturing step of the semiconductor structure according to some embodiments of the present disclosure.

Referring to FIG. 9, a mask layer 600 is deposited to cover a contour of the patterned photoresist layer 540. In some embodiments, the mask layer 600 is deposited using an atomic layer deposition (ALD). In some embodiments, the mask layer 600 includes silicon oxide. In other embodiments, the mask layer 600 includes silicon nitride. As illustrated in FIG. 9, the mask layer 600 covers a top surface of the patterned photoresist layer 540, sidewalls of the patterned photoresist layer 540, and a portion of top surface of the silicon layer 400. Because of ALD, a thickness T1 of the mask layer 600 is substantially uniform.

Figure 10:
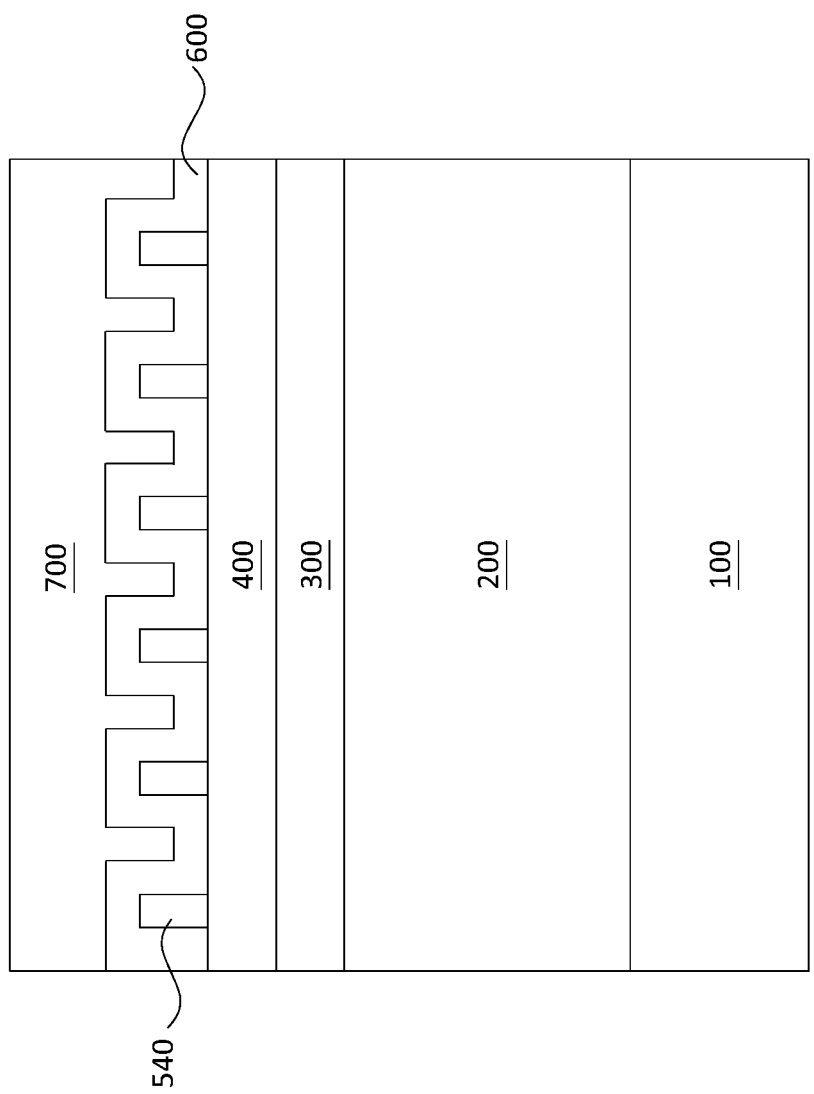
FIG. 10 is a schematic diagram of a manufacturing step of the semiconductor structure according to some embodiments of the present disclosure.

Referring to FIG. 10, a carbon layer 700 is coated on the mask layer 600. In some embodiments, the carbon layer 700 is also referred to as antireflection coating (ARC).

Figure 11:
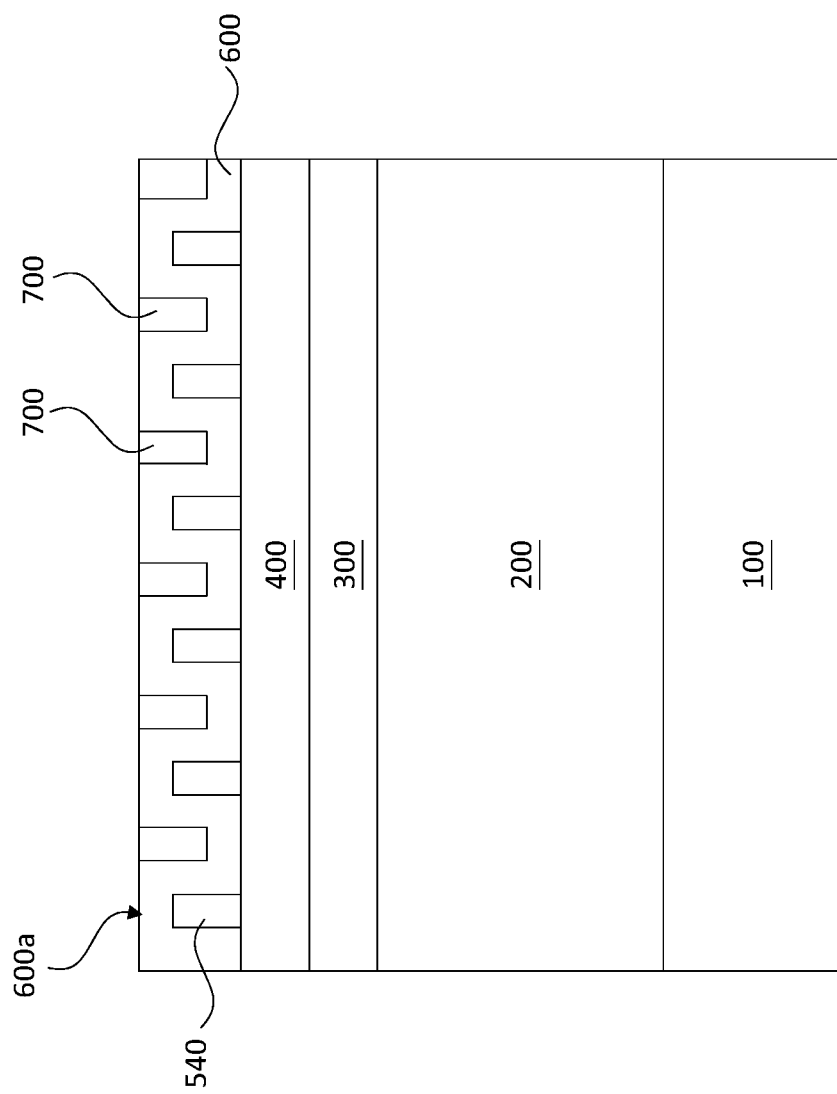
FIG. 11 is a schematic diagram of a manufacturing step of the semiconductor structure according to some embodiments of the present disclosure.

Referring to FIG. 11, the carbon layer 700 is etched to expose a top surface 600a of the mask layer 600. In some embodiments, the carbon layer 700 is etched using a first etchant.

Figure 12:
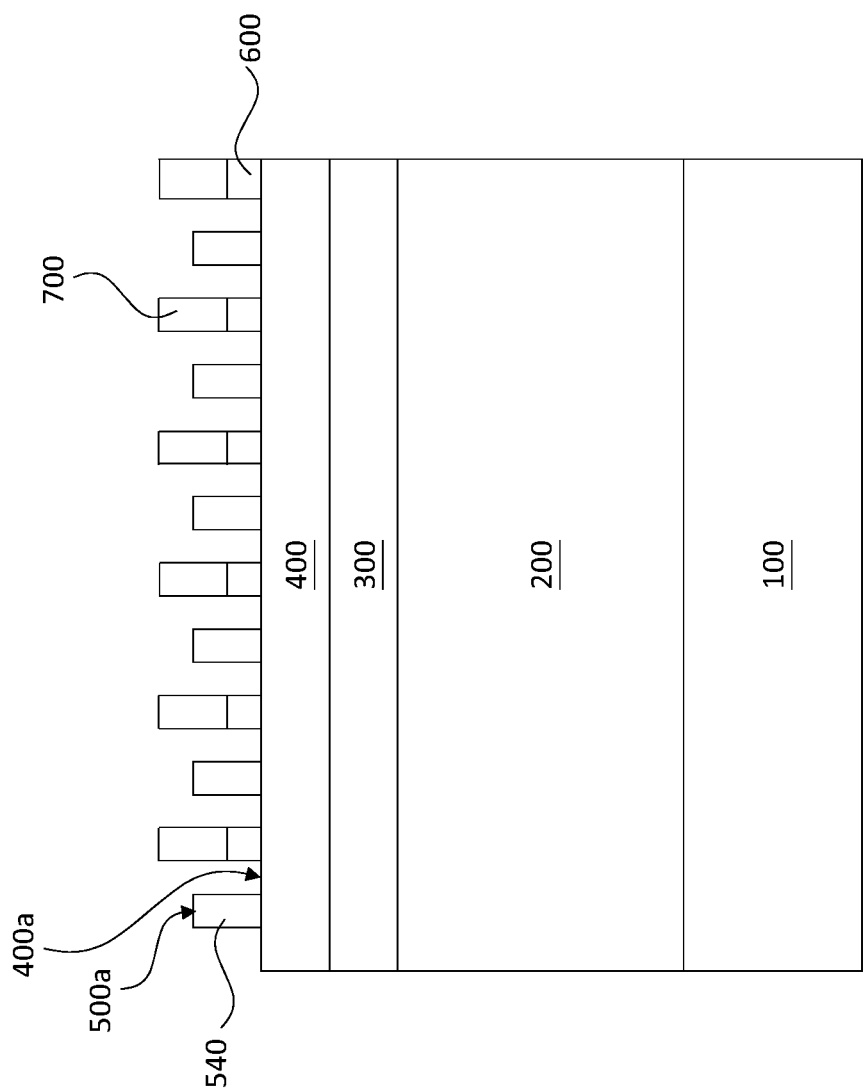
FIG. 12 is a schematic diagram of a manufacturing step of the semiconductor structure according to some embodiments of the present disclosure.

Referring to FIG. 12, the mask layer 600 is etched to expose a top surface 500a of the patterned photoresist layer 500 and a top surface 400a of the silicon layer 400. In some embodiments, the mask layer 600 is etched using a second etchant, and the first etchant is different from the second etchant. After the top surface 500a of patterned photoresist layer 500 and the top surface 400a of the silicon layer 400 are exposed, a portion of the mask layer 600 is still remained beneath the carbon layer 700 as illustrated in FIG. 12. In other words, the second etchant does not etch the carbon layer 700, therefore, the portion of the mask layer 600 beneath the carbon layer 700 is masked by the carbon layer 700.

Figure 13:
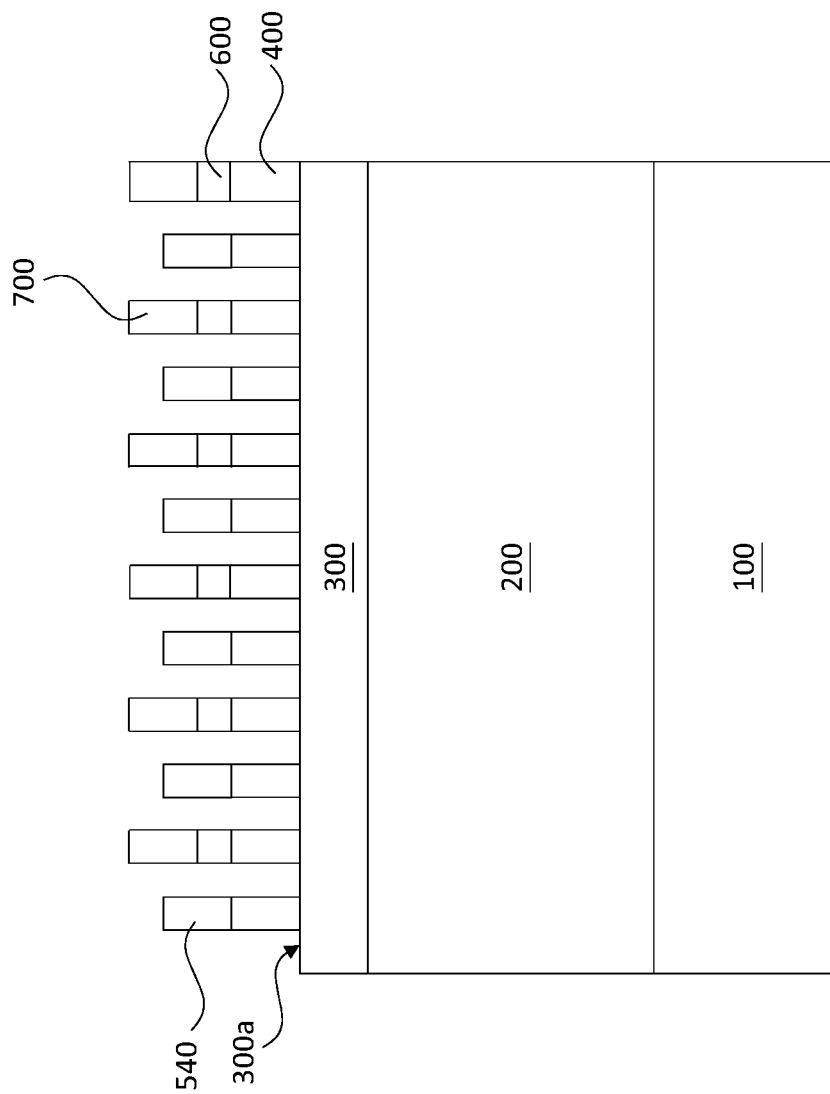
FIG. 13 is a schematic diagram of a manufacturing step of the semiconductor structure according to some embodiments of the present disclosure.

Referring to FIG. 13, the silicon layer 400 is etched to expose a top surface 300a of the nitride layer 300. In some embodiments, the silicon layer 400 is etched using a third etchant, and the third etchant is different from the second etchant.

Figure 14:
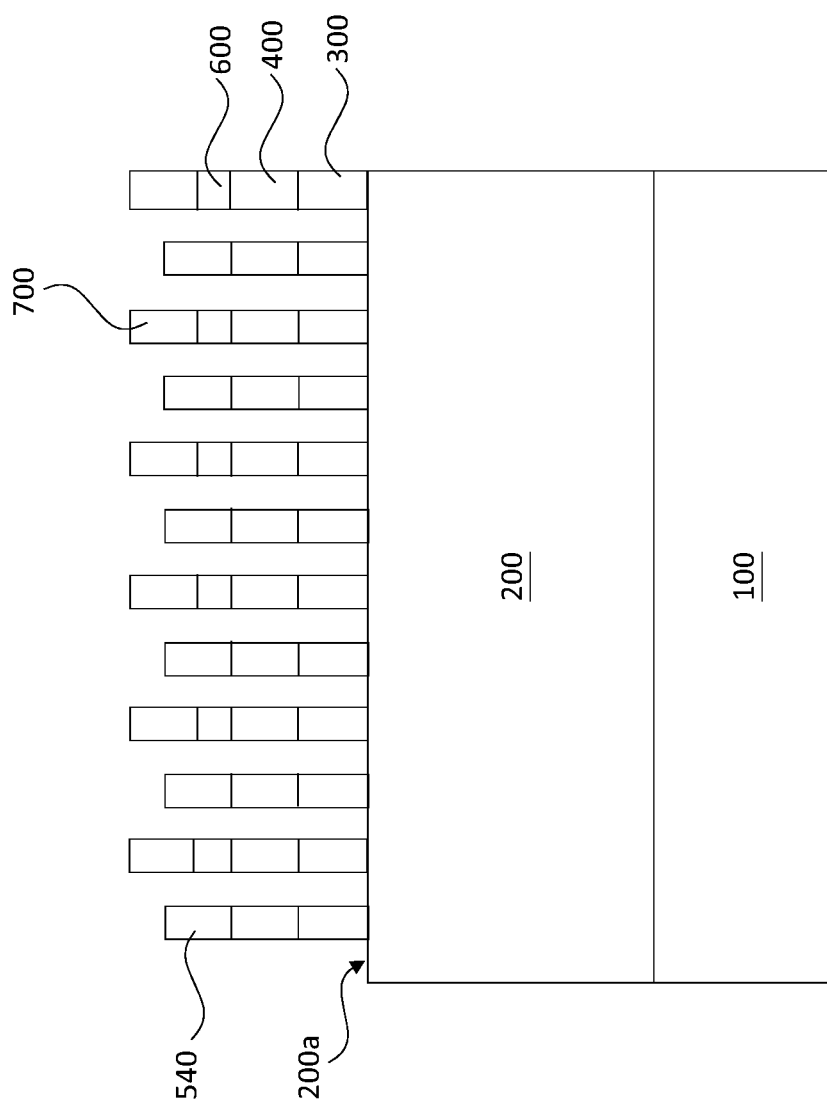
FIG. 14 is a schematic diagram of a manufacturing step of the semiconductor structure according to some embodiments of the present disclosure.

Referring to FIG. 14, the nitride layer 300 is etched to expose a top surface 200a of the oxide layer 200. In some embodiments, before the nitride layer 300 is etched, the remaining portion of silicon layer 400, the patterned photoresist layer 540, the mask layer 600, and the carbon layer 700 are removed.

Figure 15:
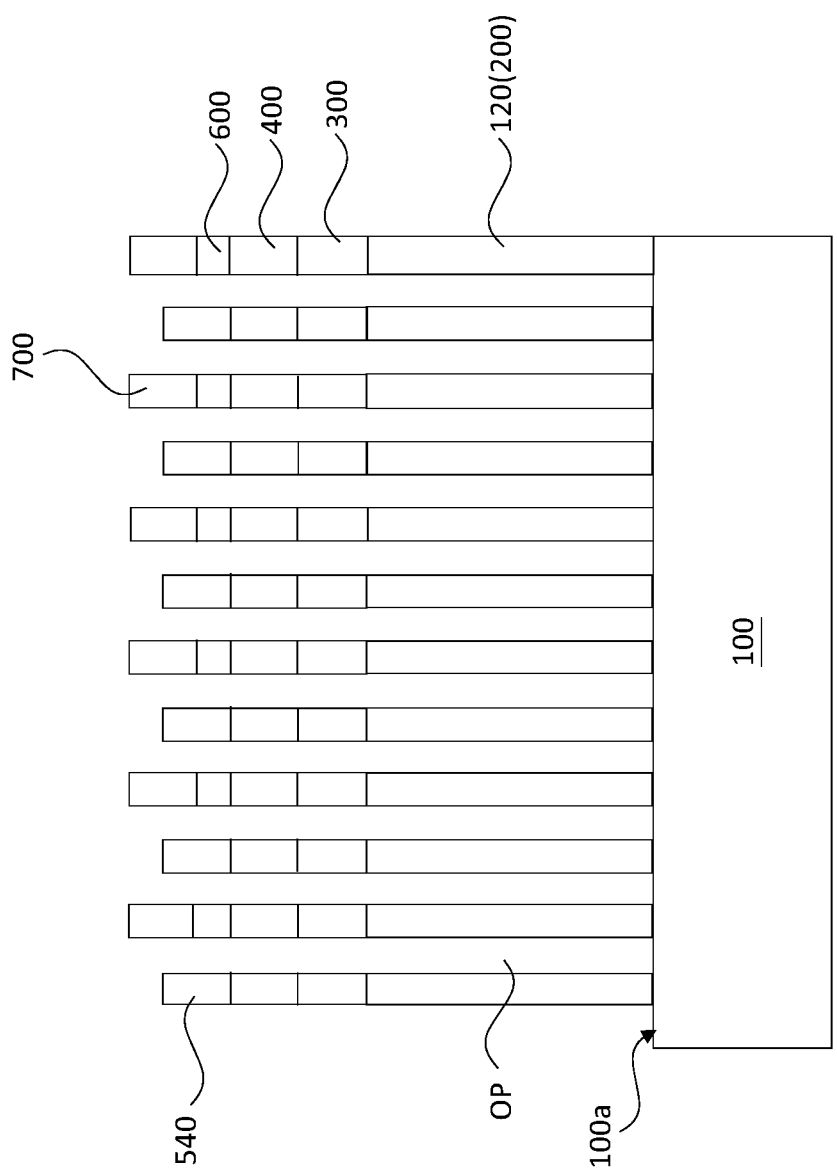
FIG. 15 is a schematic diagram of a manufacturing step of the semiconductor structure according to some embodiments of the present disclosure.

Referring to FIG. 15, the oxide layer 200 is etched to expose a top surface 100a of the substrate 100, as such, a plurality of opens OP are formed. After the oxide layer 200 is etched, the STIs 120 is formed.

Figure 16:
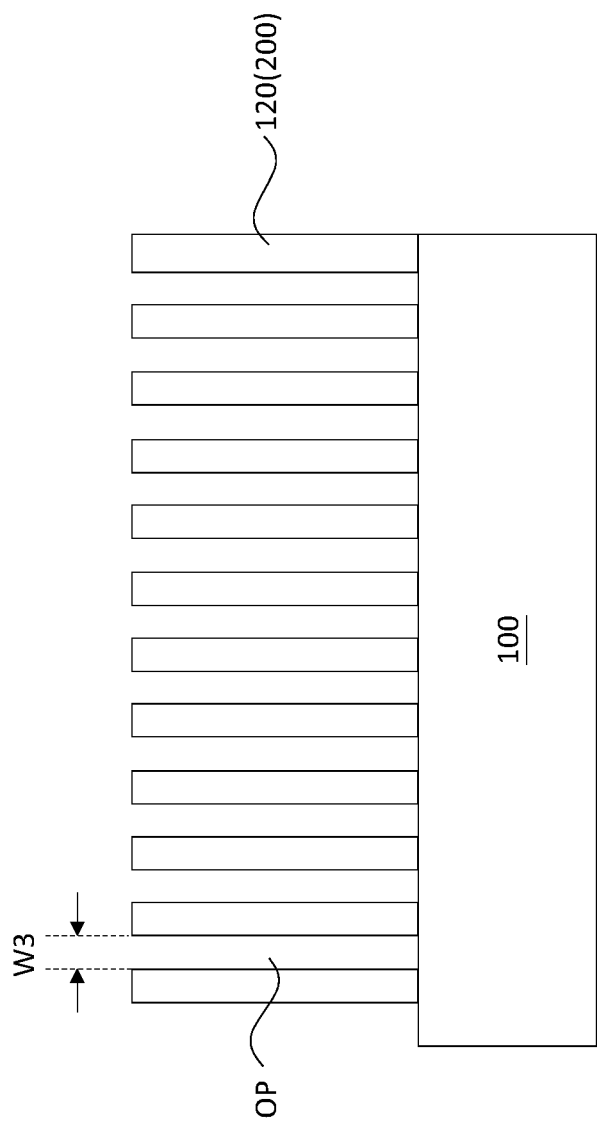
FIG. 16 is a schematic diagram of a manufacturing step of the semiconductor structure according to some embodiments of the present disclosure.

Referring to FIG. 16, the remaining portion of the nitride layer 300, the silicon layer 400, the patterned photoresist layer 540, the mask layer 600, and the carbon layer 700 are removed. In some embodiments, a width W3 of the opens OP is about 14 nm to about nm.

After the opens OP is formed, an epitaxial layer 140 (i.e., active areas 140) is grown from the top surface 100a of the substrate 100 and in the opens OP. As illustrated in FIG. 1, the epitaxial layer 140 is filled in the opens OP. In some embodiments, the epitaxial layer 140 includes silicon.

In some embodiments, a chemical mechanical planarization (CMP) is performed to planarize the epitaxial layer 140 and the oxide layer 200 (STIs 120). In some embodiments, after the CMP, the epitaxial layer 140 and the oxide layer 200 are coplanar.

In some conventional approaches, a width of the active area is not small enough, and the active areas are formed unevenly. Specifically, the conventional active areas are formed by etching the substrate and then depositing the oxide in the space where etched off to form the STIs. In these approaches, the active areas cannot be formed evenly. These factors make the semiconductor structure fail to meet the requirements of a novel technology node.

Comparing to the above conventional approaches, the present disclosure provides a method 20 (shown in FIG. 17) configured to prepare the active areas 140 on the substrate 100, wherein the active areas 140 are formed small enough and evenly, so as to meet the requirements of the novel technology node.

Figure 17:
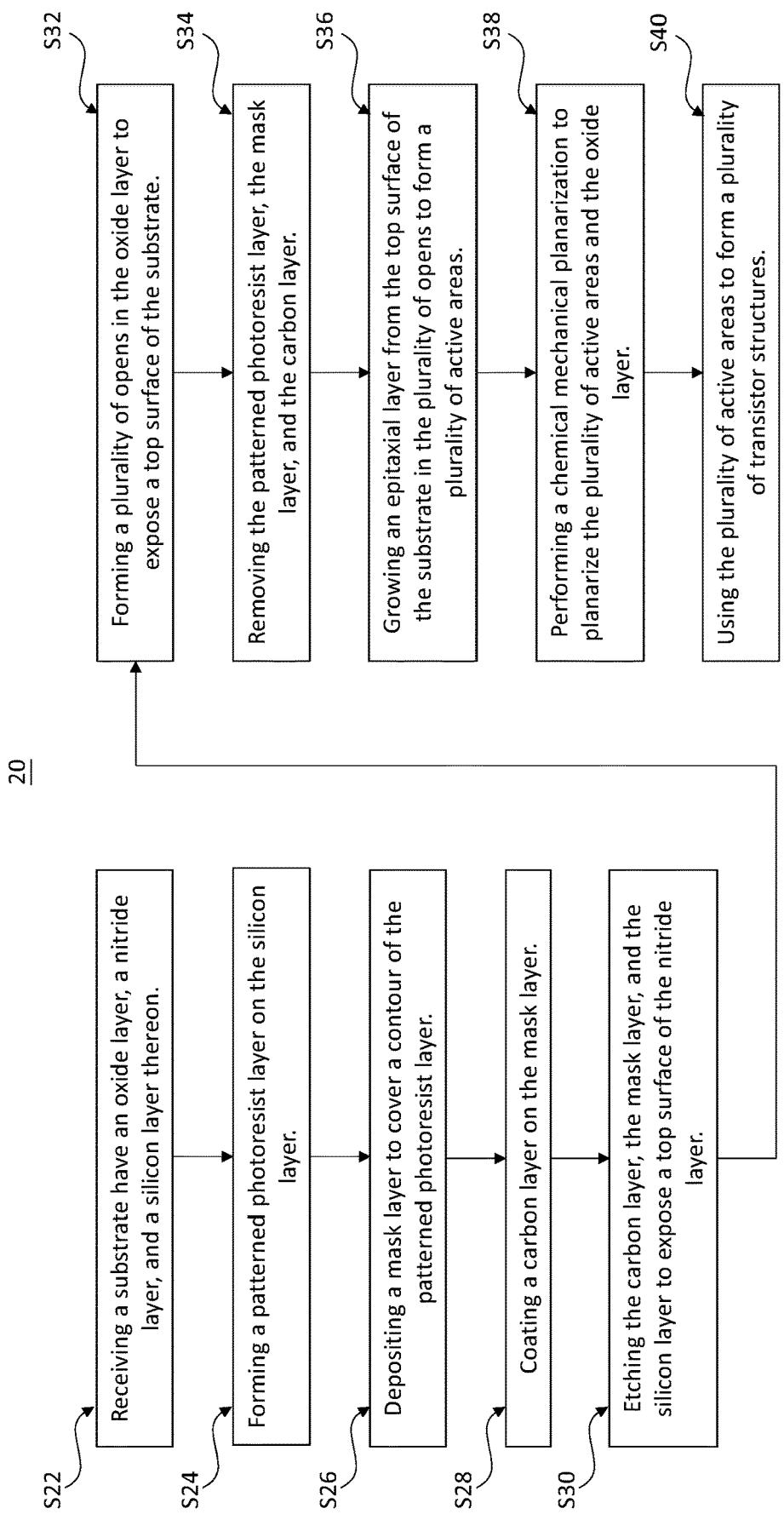
FIG. 17 is a flowchart of the method according to some embodiments of the present disclosure.

Reference is made to FIG. 17. FIG. 17 is a flowchart of the method 20 according to some embodiments of the present disclosure. The method 20 includes operations S22, S24, S26, S28, S30, S32, S34, S36, S38, and S40. To facilitating understanding, the method 20 is described with respect to FIGS. 1 to 16.

In operation S22, the substrate 100 having the oxide layer 200, the nitride layer 300, and the silicon layer 400 thereon is received. Please refer to FIG. 5, the oxide layer 200, the nitride layer 300, and the silicon layer 400 are stacked on the substrate 100.

In operation S24, as illustrated in FIG. 8, the patterned photoresist layer 540 is formed on the silicon layer 400.

In operation S26, the mask layer 600 is deposited to cover the contour of the patterned photoresist layer 540 as illustrated in FIG. 9.

In operation S28, the carbon layer 700 is coated on the mask layer 600 as illustrated in FIG. 10.

In operation S30, the carbon layer 700, the mask layer 600, and the silicon layer 400 are etched to expose the top surface 300a of the nitride layer 300 as illustrated in FIG. 13.

In operation S32, as illustrated in FIG. 15, the plurality of opens OP are formed in the oxide layer 200, and the top surface 100a of the substrate 100 is exposed.

In operation S34, the patterned photoresist layer 540, the mask layer 600, and the carbon layer 700 are removed as illustrated in FIG. 16.

In operation S36, the epitaxial layer 140 is grown from the top surface 100a of the substrate 100 and in the opens OP, so as to form the active areas 140 as illustrated in FIG. 1.

In operation S38, the CMP is performed to planarize the active areas 140 and the oxides layer 200 (STIs 120).

In operation S40, the active areas 140 are used to form the transistor structures.

Figure 18:
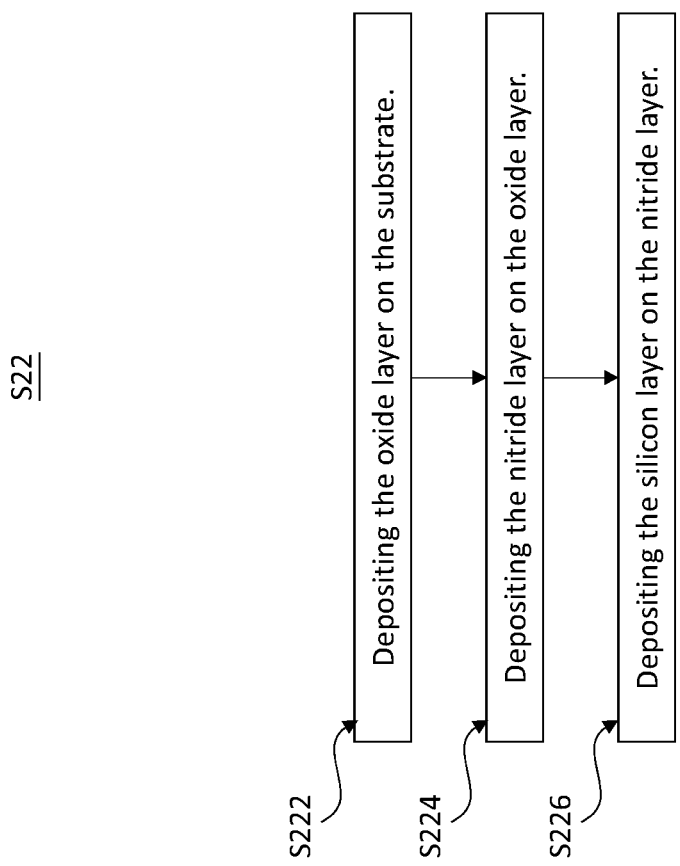
FIG. 18 is a flowchart of an operation of the method according to some embodiments of the present disclosure.

Reference is made to FIG. 18. FIG. 18 is a flowchart of the operation S22 of the method 20 according to some embodiments of the present disclosure. The operation S22 includes operations S222, S224, and S226.

In operation S222, the oxide layer 200 is deposited on the substrate 100 as illustrated in FIG. 3.

In operation S224, the nitride layer 300 is deposited on the oxide layer 200 as illustrated in FIG. 4.

In operation S226, the silicon layer 400 is deposited on the nitride layer 300 as illustrated in FIG. 5.

Figure 19:
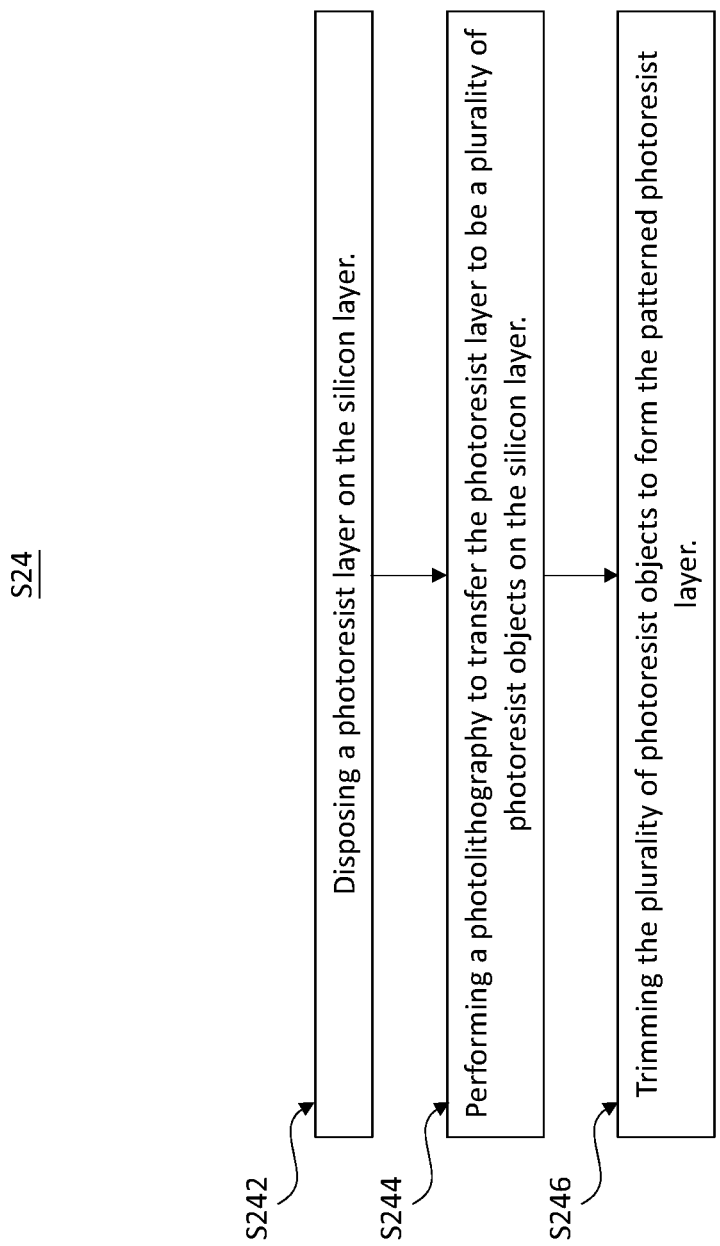
FIG. 19 is a flowchart of an operation of the method according to some embodiments of the present disclosure.

Reference is made to FIG. 19. FIG. 19 is a flowchart of the operation S24 of the method 20 according to some embodiments of the present disclosure. The operation S24 includes operations S242, S244, and S246.

In operation S242, the photoresist layer 500 is deposed on the silicon layer 400 as illustrated in FIG. 6.

In operation S244, the photolithography is performed to transfer the photoresist layer 500 to be the plurality of photoresist objects 520 on the silicon layer 400. As illustrated in FIG. 7, the photoresist layer 500 is patterned and etched to be the plurality of photoresist objects 520.

In operation S246, the plurality of photoresist objects 520 are trimmed to form the patterned photoresist layer 540 as illustrated in FIG. 8.

Figure 20:
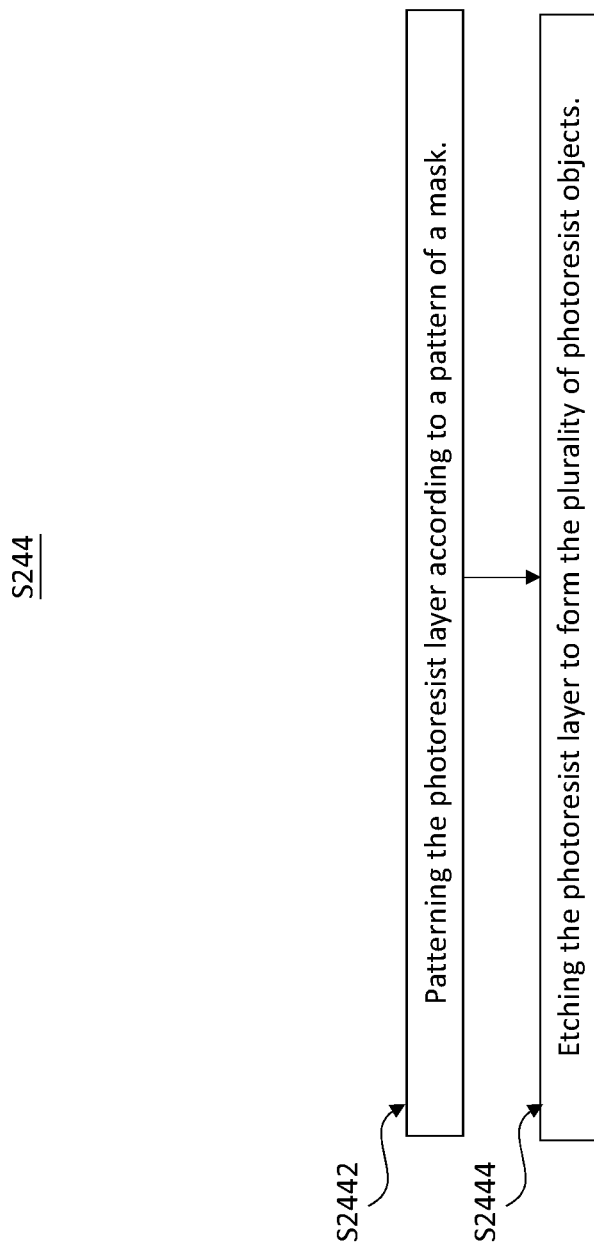
FIG. 20 is a flowchart of an operation of the method according to some embodiments of the present disclosure.

Reference is made to FIG. 20. FIG. 20 is a flowchart of the operation S244 of the method 20 according to some embodiments of the present disclosure. The operation S244 includes operations S2442 and S2444.

In operation S2442, the photoresist layer 500 is patterned according to a pattern of a mask.

In operation S2444, the photoresist layer 500 is etched to form the plurality of photoresist objects 520.

Figure 21:
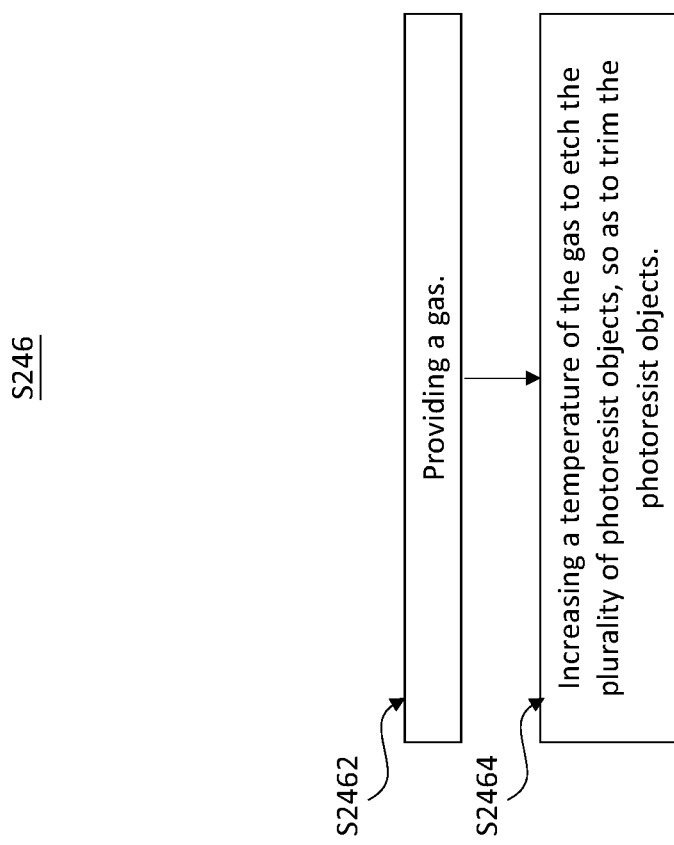
FIG. 21 is a flowchart of an operation of the method according to some embodiments of the present disclosure.

Reference is made to FIG. 21. FIG. 21 is a flowchart of the operation S244 of the method 20 according to some embodiments of the present disclosure. The operation S246 includes operations S2462 and S2464.

In operation S2462, the gas is provided to the photoresist objects 520.

In operation S2464, the temperature of the gas and the photoresist objects 520 is increased to etch the photoresist objects 520, so as to trim the photoresist objects 520.

Figure 22:
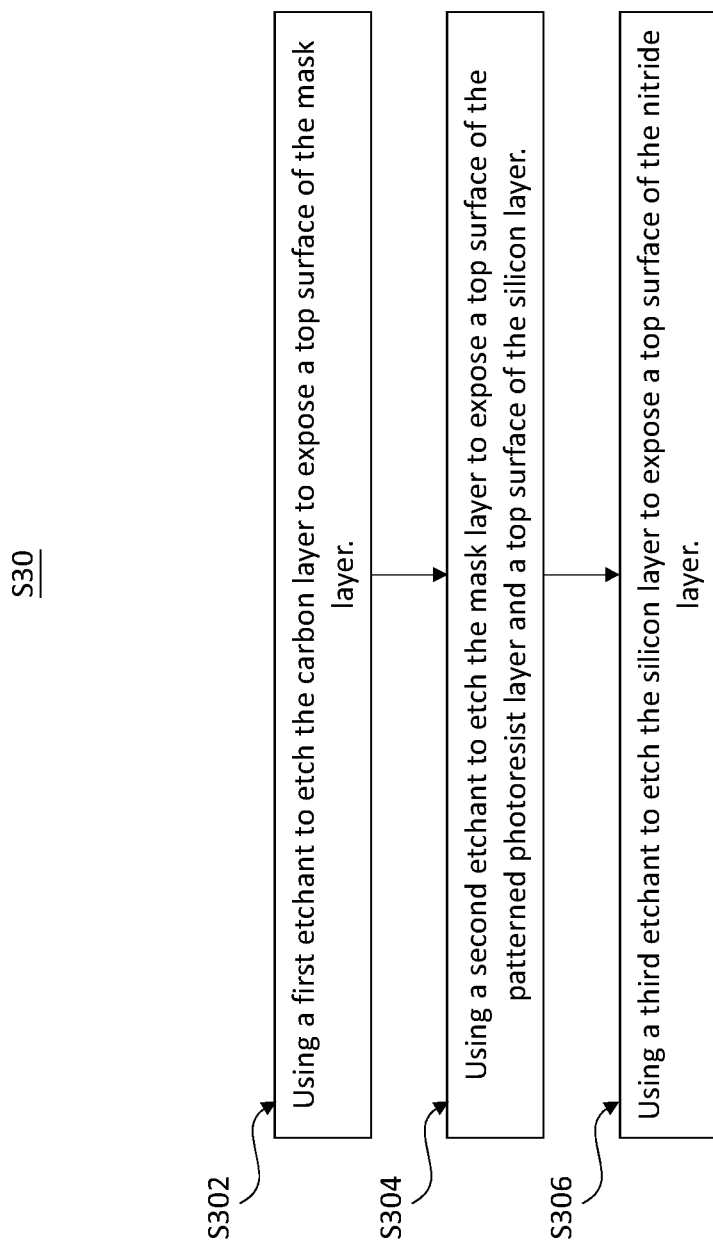
FIG. 22 is a flowchart of an operation of the method according to some embodiments of the present disclosure.

Reference is made to FIG. 22. FIG. 22 is a flowchart of the operation S30 of the method 20 according to some embodiments of the present disclosure. The operation S30 includes operations S302, S304, and S306.

In operation S302, as illustrated in FIG. 11, the carbon layer 700 is etched using the first etchant to expose the top surface 600a of the mask layer 600.

In operation S304, as illustrated in FIG. 12, the mask layer 600 is etched using the second etchant to expose the top surface 500a of the patterned photoresist layer 540 and the top surface 400a of the silicon layer 400.

In operation S306, as illustrated in FIG. 13, the silicon layer 400 etched using the third etchant to expose the top surface 300a of the nitride layer 300.

In some embodiments, the method 20 includes a pitch doubling process, more specifically, a reverse pitch doubling process. The width W3 of the opens OP is substantially half the width W1 of the photoresist objects 520.

One aspect of the present disclosure provides a method of preparing active areas. The method includes the operations of: receiving a substrate having an oxide layer, a nitride layer, and a silicon layer thereon; forming a patterned photoresist layer on the silicon layer; depositing a mask layer to cover a contour of the patterned photoresist layer; coating a carbon layer on the mask layer; etching the carbon layer, the mask layer, and the silicon layer to expose a top surface of the nitride layer; forming a plurality of opens in the oxide layer to expose a top surface of the substrate; and growing an epitaxial layer from the top surface of the substrate in the plurality of opens to form the active areas.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods and steps.

What is claimed is:

1. A method of preparing active areas, comprising:
receiving a substrate having an oxide layer, a nitride layer, and a silicon layer thereon;
forming a patterned photoresist layer on the silicon layer;
depositing a mask layer to cover a contour of the patterned photoresist layer;
coating a carbon layer on the mask layer;
etching the carbon layer, the mask layer, and the silicon layer to expose a top surface of the nitride layer, wherein the mask layer is deposited using an atomic layer deposition, and etching the carbon layer comprises using a first etchant to etch the carbon layer to expose a top surface of the mask layer;

forming a plurality of opens in the oxide layer to expose a top surface of the substrate;

growing an epitaxial layer from the top surface of the substrate in the plurality of opens to form the active areas; and performing a chemical mechanical planarization to planarize the active areas and the oxide layer.

2. The method of claim 1, further comprising:
removing the patterned photoresist layer, the mask layer, and the carbon layer.

3. The method of claim 1, wherein the mask layer comprises silicon oxide.

4. The method of claim 1, wherein the mask layer comprises silicon nitride.

5. The method of claim 1, wherein a width of each of the opens ranges from about 14 nm to 30 nm.

6. The method of claim 1, wherein the epitaxial layer comprises silicon.

7. The method of claim 1, wherein receiving the substrate having the oxide layer, the nitride layer, and the silicon layer thereon comprises:
depositing the oxide layer on the substrate;
depositing the nitride layer on the oxide layer; and
depositing the silicon layer on the nitride layer.

8. The method of claim 7, wherein the oxide layer comprises silicon oxide, the nitride layer comprises silicon nitride, and the silicon layer is an amorphous silicon layer.

9. The method of claim 1, wherein the active areas and the oxide layer are coplanar after the chemical mechanical planarization.

10. The method of claim 9, further comprising:
using the active areas to form a plurality of transistor structures.

11. The method of claim 10, wherein the oxide layer comprises shallow trench isolations of the plurality of transistor structures.

12. The method of claim 1, wherein etching the carbon layer, the mask layer, and the silicon layer to expose the top surface of the nitride layer comprises: using a second etchant to etch the mask layer to expose a top surface of the patterned photoresist layer and a top surface of the silicon layer.

13. The method of claim 12, wherein etching the carbon layer, the mask layer, and the silicon layer to expose the top surface of the nitride layer comprises: using a third etchant to etch the silicon layer to expose a top surface of the nitride layer.

14. The method of claim 13, wherein the first etchant is different from the second etchant, and the second etchant is different from the third etchant.

15. The method of claim 1, wherein forming the patterned photoresist layer on the silicon layer comprises:
disposing a photoresist layer on the silicon layer;
performing a photolithography to transfer the photoresist layer to be a plurality of photoresist objects on the silicon layer; and
trimming the plurality of photoresist objects to form the patterned photoresist layer.

16. The method of claim 15, wherein a width of each of the plurality of photoresist objects after trimming is less than a width of each of the plurality of photoresist objects before trimming.

17. The method of claim 15, wherein a dimension of each of the plurality of photoresist objects after trimming is less than a dimension of each of the plurality of photoresist objects before trimming.

18. The method of claim 15, wherein performing the photolithography to transfer the photoresist layer to be the plurality of photoresist objects on the silicon layer comprises:
patterning the photoresist layer according to a pattern of a mask; and
etching the photoresist layer to form the plurality of photoresist objects.

19. The method of claim 15, wherein trimming the plurality of photoresist objects to form the patterned photoresist layer comprises:
providing a gas; and
increasing a temperature of the gas to etch the plurality of photoresist objects, so as to trim the photoresist objects.

20. The method of claim 19, wherein the gas comprises oxygen.

* * * * *